United States Patent
Kawamura et al.

(10) Patent No.: US 6,627,356 B2
(45) Date of Patent: Sep. 30, 2003

(54) PHOTOMASK USED IN MANUFACTURING OF SEMICONDUCTOR DEVICE, PHOTOMASK BLANK, AND METHOD OF APPLYING LIGHT EXPOSURE TO SEMICONDUCTOR WAFER BY USING SAID PHOTOMASK

(75) Inventors: Daisuke Kawamura, Yokohama (JP); Hiroshi Nomura, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 90 days.

(21) Appl. No.: 09/815,005

(22) Filed: Mar. 23, 2001

(65) Prior Publication Data

US 2001/0028983 A1 Oct. 11, 2001

(30) Foreign Application Priority Data

Mar. 24, 2000 (JP) .................................. 2000-085421

(51) Int. Cl.⁷ ................................................ G03F 9/00
(52) U.S. Cl. .................................................... 430/5
(58) Field of Search ............................. 430/5, 322, 324

(56) References Cited

U.S. PATENT DOCUMENTS

| | | | |
|---|---|---|---|
| 5,279,911 A | | 1/1994 | Kamon et al. ............... 430/5 |
| 5,422,206 A | * | 6/1995 | Kamon ....................... 430/5 |
| 5,589,305 A | * | 12/1996 | Tomofuji et al. ............ 430/5 |
| 5,674,624 A | * | 10/1997 | Miyazaki et al. ........... 428/422 |
| 5,686,209 A | * | 11/1997 | Iwamatsu et al. ........... 430/5 |
| 5,780,161 A | * | 7/1998 | Hsu ........................... 428/426 |
| 6,359,735 B1 | * | 3/2002 | Gombert et al. ............ 359/580 |
| 2002/0132171 A1 | * | 9/2002 | Levinson .................... 430/5 |

FOREIGN PATENT DOCUMENTS

| | | |
|---|---|---|
| JP | 3-102353 | 4/1991 |
| JP | 7-211617 | 8/1995 |

OTHER PUBLICATIONS

Kirk, J.P., "Scattered Light in Photolithographic Lenses", O ptical/Laser Microlithography VII, SPIE–The International Society for Optical Engineering, vol. 2197, pp. 566–572, (1994).

Progler, C. et al., "Potential Causes of Across Field CD Variation", O ptical Microlithography X, SPIE–The International Society of Optical Engineering, vol. 3051, pp. 660–671, (1997).

Luce, E. et al., "Flare Im pact on the Intrafield CD control for Sub–0.25 $\mu$m Patterning", O ptical Microlithography XII, SPIE–The International Society for Optical Engineering, vol. 3679, pp. 368–381, (1999).

\* cited by examiner

Primary Examiner—S. Rosasco
(74) Attorney, Agent, or Firm—Finnegan, Henderson, Farabow, Garret & Dunner, L.L.P.

(57) ABSTRACT

The photomask of the present invention comprises a transparent substrate, a pattern, and a calcium fluoride film. The transparent substrate has a first main surface and a second main surface opposite to the first main surface and is transparent to the exposed light. The pattern is formed on the first main surface of the transparent substrate and has at least one of a opaque film, a translucent film, and a phase control film. The opaque film does not transmit the exposed light. The translucent film partly transmits the exposed light. Further, the phase control film serves to control the phase of the exposed light. The calcium fluoride film is formed on the second main surface of the transparent substrate and performs the function of an antireflection coating for suppressing the re-reflection of light on the back surface of the transparent substrate.

7 Claims, 11 Drawing Sheets

CROSS SECTIONAL SHAPE OF RESIST WITH
PHOTOMASK HAVING LARGE COVERING RATE

PSEUDO FLARE + PHOTOMASK HAVING
LARGE COVERING RATE

PHOTOMASK HAVING PERIODIC
PATTERN ARRANGED ON
ENTIRE SURFACE

PHOTOMASK USED IN MANUFACTURING OF SEMICONDUCTOR DEVICE, PHOTOMASK BLANK, AND METHOD OF APPLYING LIGHT EXPOSURE TO SEMICONDUCTOR WAFER BY USING SAID PHOTOMASK

CROSS-REFERENCE TO RELATED APPLICATIONS

This application is based upon and claims the benefit of priority from the prior Japanese Patent Application No. 2000-085421, filed Mar. 24, 2000, the entire contents of which are incorporated herein by reference.

BACKGROUND OF THE INVENTION

The present invention relates to a photomask used in the manufacture of a semiconductor device, a photomask blank, and a method of applying a light exposure treatment to a semiconductor wafer by using said photomask.

In recent years, with progress in the degree of integration of the semiconductor device and in the miniaturization of the semiconductor element, the required pattern size is approaching the resolution limit of the light exposure apparatus. Therefore, a so-called "resolution enhancement technology" such as an oblique illumination method and a phase control mask has come to be positively employed in the pattern transfer. Also, in the patterning process of a resist, the thickness of the resist film is being decreased in an attempt to extend the resolution limit and to widen the focus latitude.

In an ideal optical system, if the pattern arrangement on a mask is the same within a range affected by the optical proximity effect, the optical contrast of the transferred pattern, the exposure latitude and the profile of the resist pattern become the same.

However, with improvement in the resolution performance, a problem is actually generated that patterns are made different in the cross sectional profile of the resist film and the focus· exposure latitude depending on the difference in the peripheral pattern (construction), even if the patterns are exactly the same in the design.

For example, a photomask having a fine pattern arranged on the entire surface is made different from a photomask having the periphery of a fine pattern covered with an opaque film in the cross sectional profile of the resist even if these photomasks are the same in the pattern design. To be more specific, in a line/space (L/S) pattern of 300 $\mu$m square, in which the influence of the ordinary optical proximity effect is negligible, the light exposure sensitivity is improved so as to lower the light exposure latitude in the case where the average covering ratio of the periphery with an opaque film is 30%, compared with the case where the entire periphery is covered with an opaque film. Therefore, if a positive resist is used in the case where the average covering ratio is 30%, the head portion of the resist profile is rendered roundish.

These phenomena are considered to be caused by the irradiation of the resist with a back ground light (flare), which is not generated in an ideal optical system, so as to lower the optical contrast.

The flare in the light exposure apparatus is evaluated in general by the method described in publication 1 [J. P. Kirk, "Scattered light in photolithographic lenses", Proc. SPIE (1994)].

In the case of using a photomask in which a large opaque pattern, i.e., scores of micrometers square, is present on a transparent substrate, the light must not reach that region of a silicon wafer which is positioned right under the opaque pattern. However, if the exposure Dose is gradually increased, the particular region of the silicon wafer is exposed to light because of the flare. Publication 1 quoted above discloses a method of numerically expressing the amount of the flare by utilizing the phenomenon described above.

The influences given by the flare to the device pattern are described in publication 2 [C. Progler, "Potential causes of across field CD variation", Proc. SPIE (1997)] and publication 3 [E. Luce, "Flare impact on the intrafield CD control for sub-0.25 $\mu$m patterning", Proc. PPIE (1999)].

These publications 2 and 3 teach that the amount of the flare is distributed substantially concentrically within the light exposure region. On the other hand, it has been experimentally confirmed that the size of the resist pattern is concentrically changed.

FIG. 1 schematically shows the situation of the light exposure in the case of using a conventional photomask. In the drawing, the general flare is involved in the reflection from the surface of a lens 81 (projection optics system), from the upper surface and lower surface of a photomask 82 including a quartz glass substrate 821 and a laminate film 822 consisting of a Cr film and an oxidized Cr film and acting as a opaque film, and from the surface of a wafer 83. The flare can be divided into a flare generated on the upstream side (illuminating optics system) of the photomask 82 and a flare generated on the downstream side (projection optics system) of the photomask 82. A reference numeral 841 in the drawing denotes an unexposed portion of the resist, with a reference numeral 842 denoting light-exposed portion of the resist.

In each of these cases, the amount of the flare is considered to be proportional to the covering ratio (i.e., area of the opaque film/area of the quartz glass substrate) of the photomask 82. The flare is considered to boost the light intensity distribution on the wafer 83 as a background so as to lower the contrast of the pattern.

However, as a result of an extensive research conducted by the present inventors, it has been clarified that the change in the cross sectional profile of the resist film etc., which is derived from the difference in the peripheral pattern of the photomask 82, is irrelevant to the flare as described herein later in detail.

BRIEF SUMMARY OF THE INVENTION

An object of the present invention, which has been achieved in view of the situation described above, is to provide a photomask having an object pattern and a peripheral pattern formed in the periphery of the object pattern, which permits performing a light exposure that is unlikely to be affected by the peripheral pattern and to provide a photomask blank used for preparing the particular photomask.

Another object of the present invention is to provide a method of applying a light exposure treatment to a semiconductor wafer by using the photomask of the present invention.

As a result of an extensive research, the present inventors have found that the problem in respect of the change in the cross sectional profile of the resist pattern described above is caused by the light re-reflected from the back surface of the photomask. The present invention is basically featured in that the re-reflected light can be effectively suppressed.

According to a first aspect of the present invention, which has been achieved for achieving the objects described above, there is provided a first photomask, comprising a transparent substrate having a first main surface and a second main surface opposite to the first main surface, the substrate transmitting the exposed light; a pattern formed on the first main surface of the transparent substrate and having at least one of a opaque film, a translucent film, and a phase control film, the opaque film not transmitting the exposed light, the translucent film transmitting partly the exposed light, and the phase control film serving to control the phase of the exposed light; and a thin film formed on the second main surface of the transparent substrate and containing calcium fluoride.

In the first photomask, a thin film consisting of calcium fluoride is formed as an antireflection coating on the back surface of the transparent substrate. The refractive coefficient of an antireflection coating of an ideal single layer structure (reflection-reduced single layer film) is $n_s^{1/2}$, where $n_s$ represents the refractive coefficient of a quartz glass substrate used as the transparent substrate in the present invention.

The material having an ideal value ($=n_s^{1/2}$) of the refractive coefficient at KrF or ArF, which is known to the art nowadays, includes only calcium fluoride (fluorite) and a mixture of calcium fluoride and a suitable additive. Therefore, if the first photomask is used in the case where a KrF laser beam or an ArF laser beam is used as the exposed light, it is possible to prevent the re-reflection of light from the back surface of the first photomask, making it possible to carry out the light exposure treatment that is unlikely to be affected by the peripheral pattern. Incidentally, it is desirable for the thin film consisting of calcium fluoride to contain an additive effective for lowering the thermal expansion coefficient of the thin film.

According to a second aspect of the present invention, which has been achieved for achieving the objects described above, there is provided a second photomask, comprising a transparent substrate having a first main surface and a second main surface opposite to the exposed first main surface, the substrate transmitting the exposed light; a pattern formed on the first main surface of the transparent substrate and having at least one of a opaque film, a translucent film, and a phase control film, the opaque film not transmitting the exposed light, the translucent film transmitting partly the exposed light, and the phase control film serving to control the phase of the exposed light; and a film of a laminate structure formed on the second main surface of the transparent substrate and including at least a first thin film and a second thin film laminated one upon the other, the first thin film being interposed between the second main surface and the second thin film, and the refractive coefficient of the first thin film being larger than that of the second thin film.

In the second photomask, a film of a laminate structure including at least a first thin film and a second thin film is formed on the second main surface (back surface) of the transparent substrate. The refractive coefficient of the first thin film is larger than that of the second thin film.

The film of the particular laminate structure is expected to produce a large antireflection effect even if the first and second thin films are formed of the materials used for forming the ordinary antireflection coating. It follows that, if the second photomask is used, it is possible to prevent the re-reflection of the light from the back surface of the photomask so as to perform the light exposure treatment that is unlikely to be affected by the peripheral pattern.

In a third aspect of the present invention, which has been achieved for achieving the objects described above and which is directed to the second photomask described above, it is desirable for the photomask to meet the relationship of $n_{f1} \geq n_{f2} \times n_s^{1/2}$, where $n_s$ represents the refractive coefficient of the transparent substrate for the wavelength of the exposed light, $n_{f1}$ represents the refractive coefficient of the first thin film, and $n_{f2}$ represents the refractive coefficient of the second thin film.

Where the relationship of $n_{f1} \geq n_{f2} \times n_s^{1/2}$ is satisfied, it is possible to reduce the reflectance on the back surface of the transparent substrate to substantially zero. It follows that it is possible to carry out the light exposure treatment that is unlikely to be affected by the peripheral pattern, if the materials satisfying the relationship given above are used for forming the transparent substrate, the first thin film and the second thin film. To be more specific, it is desirable for the transparent substrate to be formed of quartz, for the first thin film to be formed of magnesium oxide, and for the second thin film to be formed of magnesium fluoride.

In the photolithography in the future, in which an ArF laser, an $F_2$ laser, etc. are used as the light source, it is possible for the materials meeting the relationship of $n_{f1} \geq n_{f2} \times n_s^{1/2}$ not to be used or not to be present. In such a case, a high antireflection effect can be expected by using a film of a laminate structure formed of at least three layers including the first and second thin films. However, the dependency of the reflectance on the incident angle tends to be narrowed with increase in the number of thin films laminated one upon the other no matter what materials may be combined for forming the thin films. Therefore, the upper limit in the practical number of layers included in the laminate structure is about 10.

An antireflection coating is known to the art for a long time. The conventional antireflection coating is intended to prevent the generation of the flare caused by the reflection from the interface between the transparent substrate and the pattern formed of a opaque film and formed on the surface of the transparent substrate and to prevent the generation of the flare caused by the reflection from the surface of the pattern, because the reflections pointed out above occupy substantially all the reflection from the entire photomask. However, the flare that is to be suppressed in the present invention is not the flare caused by the conventional reflection but the flare caused by the reflection from the back surface of the transparent substrate. It follows that the present invention quite differs from the prior art in the flare that is to be suppressed.

FIG. 2 shows the situation of the light exposure treatment in the case of using the photomask of the present invention. Unlike the conventional photomask 82 shown in FIG. 1, an antireflection coating 85 is formed on the back surface of a quartz glass substrate 821 in the photomask of the present invention as shown in FIG. 2.

The photomask of the present invention is featured in that the antireflection coating 85 is formed of a material having an optical constant effective for lowering the reflectance of the reflected light of the exposed light that is incident on the interface between the quartz glass substrate 821 and the light exposure atmosphere (the air atmosphere), and that the antireflection coating 85 is formed in a thickness effective for lowering the reflectance of the reflected light noted above. It is desirable for the material of the antireflection coating 85 not to absorb (not to attenuate) the wavelength of the exposed light or to be very small in the absorption (attenuation). Where the material performs the absorption, it is desirable for the material of the antireflection coating 85 not to be changed by the crystallization or the generation of the point defect or the like.

In the case of using the photomask of the present invention, the reflected light on the upper surface of a wafer 83 passes through a lens 81 (projection optical system) having an antireflection measure applied thereto substantially completely so as to arrive at the surface of the photomask 82. The most of the reflected light on the surface of the wafer 83 is brought back to the position on the photomask 82 corresponding to the position on the wafer 83. In this case, since the antireflection coating 85 permits suppressing the reflected light (re-reflected light) at the interface between the back surface of the photomask 82 and the light exposure atmosphere (the air atmosphere), it is possible to effectively prevent the generation of the flare caused by the reflection from the interface noted above. It follows that it is possible to suppress sufficiently the reduction of the exposure latitude during use of the photomask having a high opening ratio. As a result, even in the case of using a positive resist and the photomask having a high opening ratio, it is possible to obtain a resist pattern 87 having a rectangular profile at head portion, which is satisfactory, as shown in FIG. 3B, as in the case of using a positive resist and the photomask having a low opening ratio, not a resist pattern 86 having a roundish head portion as shown in FIG. 3A.

According to a fourth aspect of the present invention, which is intended to achieve the objects noted above, there is provided a photomask blank, comprising a transparent substrate having a first main surface and a second main surface opposite to the first main surface, the transparent substrate transmitting the exposed light; a thin film formed on the first main surface of the transparent substrate and including at least one of a opaque film, a translucent film and a phase control film, the opaque film not transmitting the exposed light, the translucent film partly transmitting the exposed light, and the phase control film serving to control the phase of the exposed light; and a film of a laminate structure formed on the second main surface of the transparent substrate and including at least a first thin film and a second thin film laminated one upon the other, the first thin film being interposed between the second main surface of the transparent substrate and the second thin film, and the refractive coefficient of the first thin film being larger than the refractive coefficient of the second thin film.

According to a fifth aspect of the present invention, which is intended to achieve the objects noted above, there is provided a method of applying a light exposure to a semiconductor wafer, comprising a first step of calculating design data on the basis of the device function; a second step of preparing a photomask for acquisition of the optical proximity effect correction (OPC) rule on the basis of the design date; a third step of performing a light exposure for patterning a thin film on the wafer by using the photomask for acquisition of the OPC rule; a fourth step of measuring the size of the pattern formed by the light exposure on the wafer; a fifth step of acquiring the OPC rule on the basis of the size of the pattern obtained by the measurement; a six step of correcting a pattern size on a photomask by using the acquired OPC rule such that a pattern satisfying the design data in the first step is obtained on the wafer; a seventh step of preparing the photomask having the pattern size, the photomask comprising a transparent substrate having a first main surface and a second main surface opposite to the first main surface, the substrate transmitting the exposed light; a pattern to be transferred formed on the first main surface of the transparent substrate; and an antireflection coating formed on the second main surface of the transparent substrate; and an eighth step of performing a light exposure for patterning a thin film on the wafer by using the photomask prepared in the seventh step.

In the method of applying a light exposure treatment to a semiconductor wafer, which is constructed as described above, it is possible to shorten the acquisition time of the optical proximity effect correction (OPC) rule in the step of applying a light exposure treatment to the semiconductor wafer and to improve the dimensional accuracy of the pattern formed by the light exposure step by using the first photomask as the photomask for acquiring the OPC rule and by using the first photomask in the step of applying the light exposure treatment to the semiconductor wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
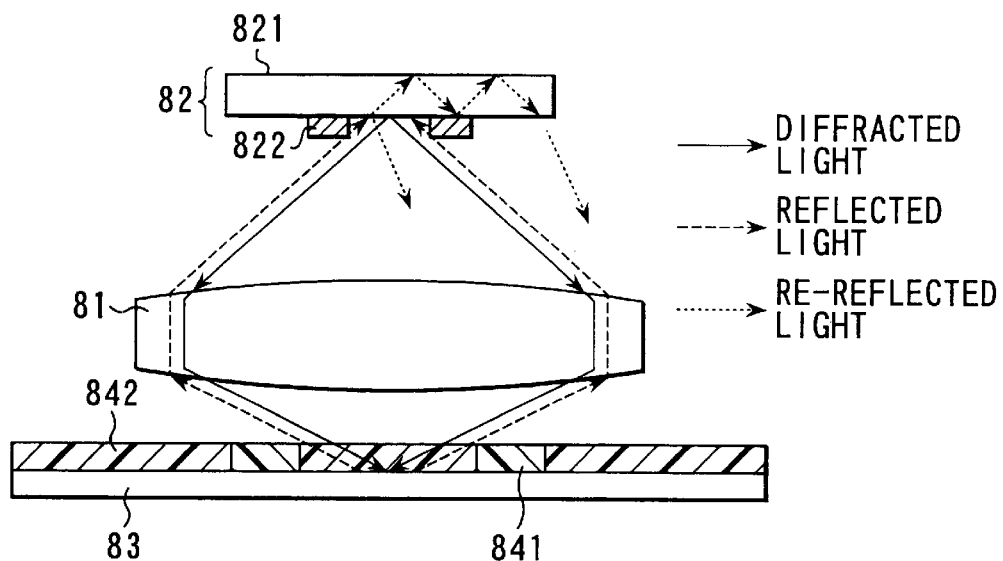
FIG. 1 schematically shows the situation of the light exposure in the case of using a conventional photomask.
Figure 2:
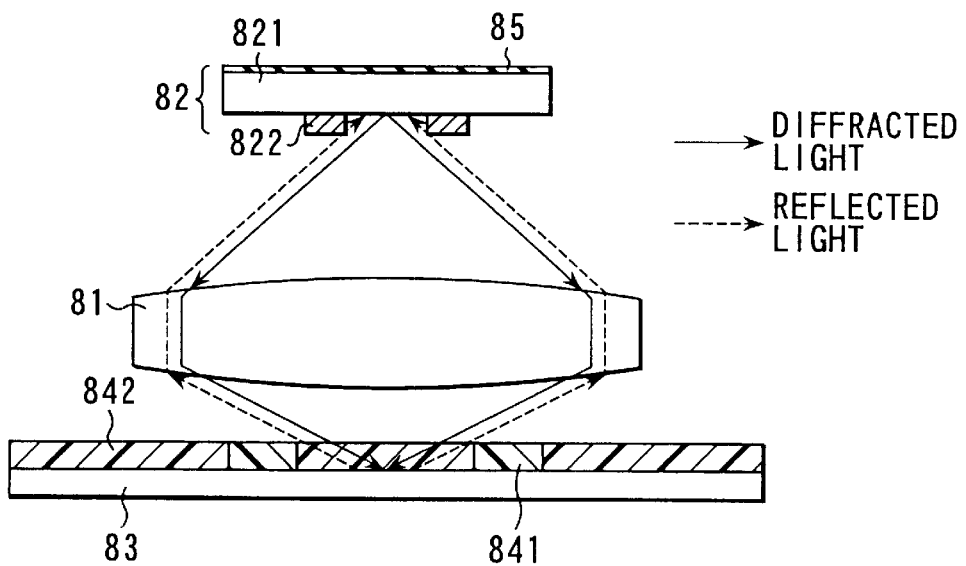
FIG. 2 schematically shows the situation of the light exposure in the case of using a photomask of the present invention.
Figures 3A, 3B:
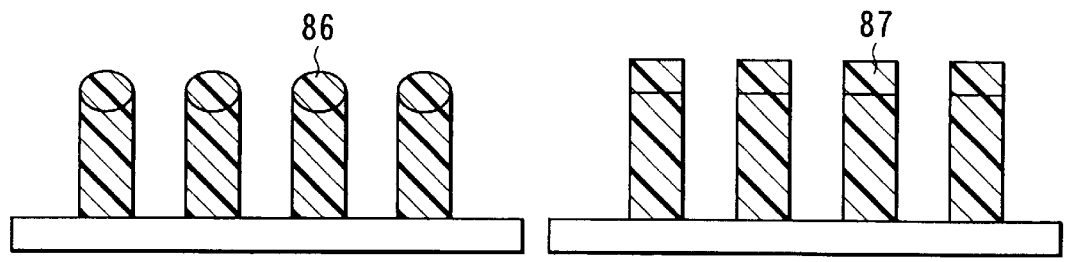
FIG. 3A is a cross sectional view of a pattern showing the effect of the light exposure in the case of using a conventional photomask.
FIG. 3B is a cross sectional view of a pattern showing the effect of the light exposure in the case of using a photomask of the present invention.

Before describing preferred embodiments of the present invention, the results of the studies and researches providing the basis of the present invention will now be described first.

A lower layer antireflection coating is generally used nowadays, and the reflection of the light from the upper surface of a wafer is determined by the reflection at the interface between the resist and the light exposure atmosphere. In the case of using, for example, a KrF resist, the reflectance is 6 to 7% with the incident light set at 1, and is about 3% even in the case of using a general upper layer antireflection coating.

The material of the resist is limited in terms of the resolution and the resistance to the dry etching. Therefore, it is difficult to lower the reflectance at the interface between the resist and the light exposure atmosphere by improving the material of the resist.

The reflected light from the upper surface of the wafer is considered to be reflected again from the lens and the photomask so as to form a flare irradiating the resist surface. However, since a substantially perfect antireflection coating is formed on the surface of the lens, the photomask is considered to provide a surface from which the reflected light coming from the upper surface of the wafer is reflected again.

An antireflection coating consisting of an oxidized Cr film is formed on the Cr film constituting an opaque portion formed on the lower surface of the photomask (photomask surface). Even in this case, the reflectance of the KrF light at the lower surface of the photomask is about 17%. The flare produces a stronger influence with increase in the opening ratio, i.e., with decrease in the areal ratio of Cr film/oxidized Cr film.

If the reflected light is brought back uniformly to the photomask, it is highly probable for the flare to have an even function-like distribution having the smallest value relative to the covering ratio, and the most portion of the light reflected from the surface of the wafer is considered to be brought back to a position on the photomask corresponding to the wafer, i.e., back to the opening portion in which the opaque portion is not formed.

On the other hand, the reflectance of the wafer is relatively large, i.e., about 9%, though an antireflection coating is not formed on any of the front surface and the back surface of the wafer. The flare is generated by the re-reflection from the front surface and back surface of the wafer as well as by the presence of a multiple reflection inside the wafer, with the result that the optical contrast is lowered in the case of using a photomask having a high opening ratio.

Under the circumstances, the present inventors have conducted a light exposure without using a photomask in an attempt to seemingly increase the flare of the light exposure apparatus, followed by immediately performing a pattern exposure by using a photomask having a high covering ratio, i.e., a photomask having the pattern periphery covered with an opaque film, so as to examine the changes in the focus and light exposure amount allowance and in the cross sectional profile of the resist.

As a result, it has been found that the focus and light exposure amount allowance tends to be narrowed with pseudo increase in the flare. However, a change in the cross sectional profile of the resist as expected was not observed. In other words, the experimental data failed to support the conventional idea that the change in the cross sectional profile of the resist is caused by the flare of the light exposure apparatus.

The conditions of the resist process are determined to achieve the largest focus and exposure Dose latitude. With progress in the thinning of the resist film, the cross sectional profile of the resist film has become an important factor. To be more specific, in the semiconductor process, the etching steps of an insulating film or an underlying film such as a metal film are repeatedly carried out with the resist pattern used as a mask. With progress in the thinning of the resist film, the cross sectional profile of the resist has come to give a serious influence to the cross sectional profile of the underlying layer after the etching step. Therefore, if a difference in the cross sectional profile of the resist film is generated by the covering ratio of the photomask as well as by the difference in the pattern between the central portion and the peripheral portion of the photomask, it is difficult to construct a uniform resist process, giving rise to the problem that it is necessary to change the resist process for every photomask.

Also, a serious influence is also given to the optical proximity effect correction (OPC) that is generally performed nowadays. To be more specific, required are rule data of OPC differing from each other for every photomask, making it difficult to obtain practical rule data.

The discussion given above can be summarized as follows:

(1) In a photomask, the cross sectional profile of the resist film is made different by the difference in the peripheral portion of the pattern.

(2) The cause of the particular phenomenon is irrelevant to the flare of the light exposure apparatus that was said to be the cause in the past.

(3) The particular phenomenon gives a serious influence to the lithography process and to the optical proximity effect correction technology.

Figure 4:
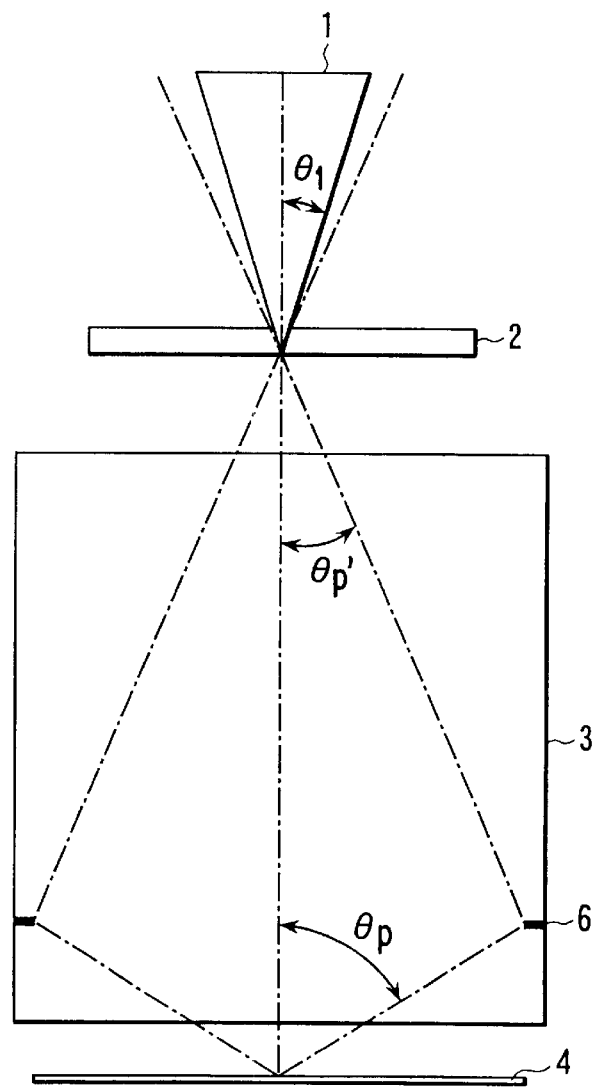
FIG. 4 schematically shows the situation of the light exposure using a light exposure apparatus.

FIG. 4 schematically shows the light exposure apparatus. A reference numeral 1 shown in the drawing represents an illuminating light (exposed light) having an expansion of $2\theta_1$. The illuminating light 1 illuminates a photomask 2 and is reduced and projected by a projection lens 3 (projection optics system), with the result that the pattern on the photomask 2 is transferred onto a resist 4 on a wafer.

The reduction rate of the pattern is represented by a ratio of NA on the upstream side of the projection lens 3 to NA on the downstream side of the projection lens 3, i.e., sin θp'/sin θp. Sin θp' represents an angle corresponding to NA on the upstream side, with sin θp representing an angle corresponding to NA on the downstream side. For example, when it comes to a light exposure apparatus having a reduction rate of ¼, the ratio of sin θp'/sin θp is ¼, i.e., sin θp'/sin θp=¼. In general, "NA (the number of apertures) of the light exposure apparatus" represents the NA on the downstream side (=sin θp).

Also, the illumination coherency σ is represented by a ratio of the illumination NA to the NA on the upstream side of the projection lens (sin $\theta_1$/sin θp'). The illumination in which the illumination coherency σ is less than 1 is called a bright-field illumination, and the illumination in which the illumination coherency is not smaller than 1 is called a dark-field illumination. In the ordinary light exposure apparatus, employed is a bright-field illumination having an illumination coherency σ of at most about 0.8.

Figure 5:
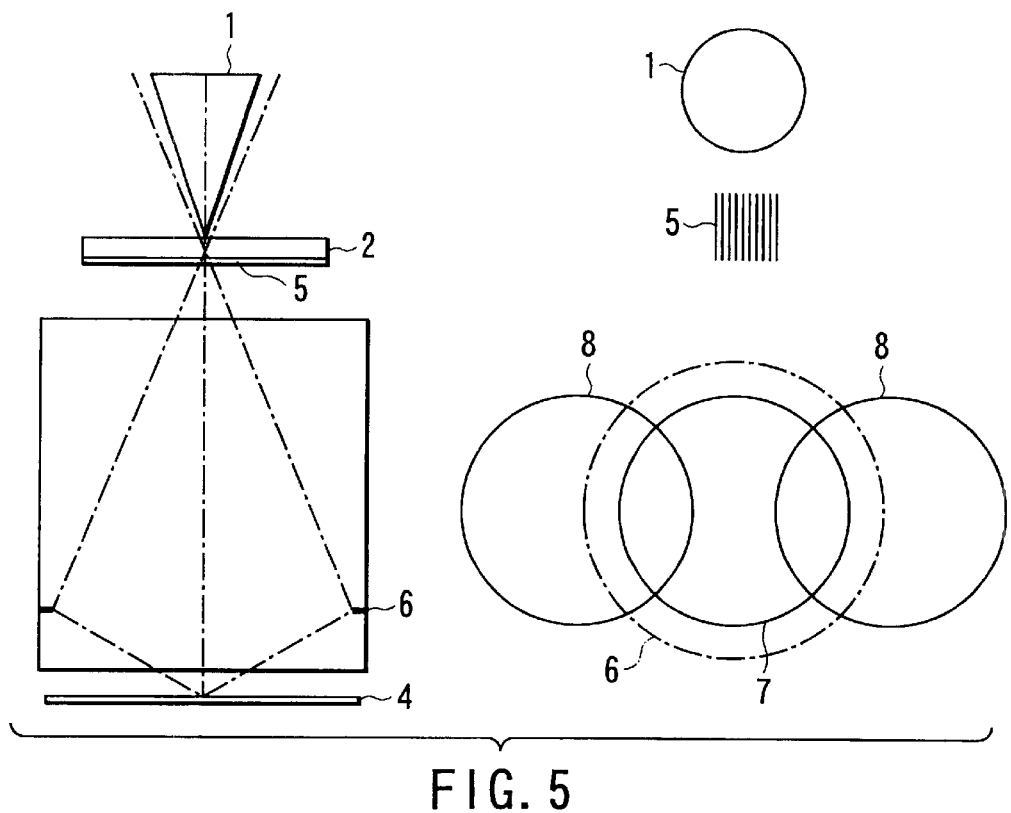
FIG. 5 schematically shows the situation of the transfer of a periodic pattern on a photomask onto a resist.

FIG. 5 schematically shows how a periodic pattern on the photomask 2 is transferred onto the resist 4.

Specifically, the illuminating light 1 is diffracted by a periodic pattern 5 arranged on the patterned surface of the photomask 2 and, then, diffracted on a pupil 6 into a zero order light 7 and a primary light 8. Only the diffracted light passing inside the pupil 6 arrives at the resist 4, with the result that the reduced periodic pattern is formed on the resist 4. The shape of the illuminating light 1 is similar to the shape of each of the diffracted lights 7 and 8. It should be noted that a ratio of the radius of the pupil 6 to the radius of the zero order light 7 represents the illumination coherency σ.

Figure 6:
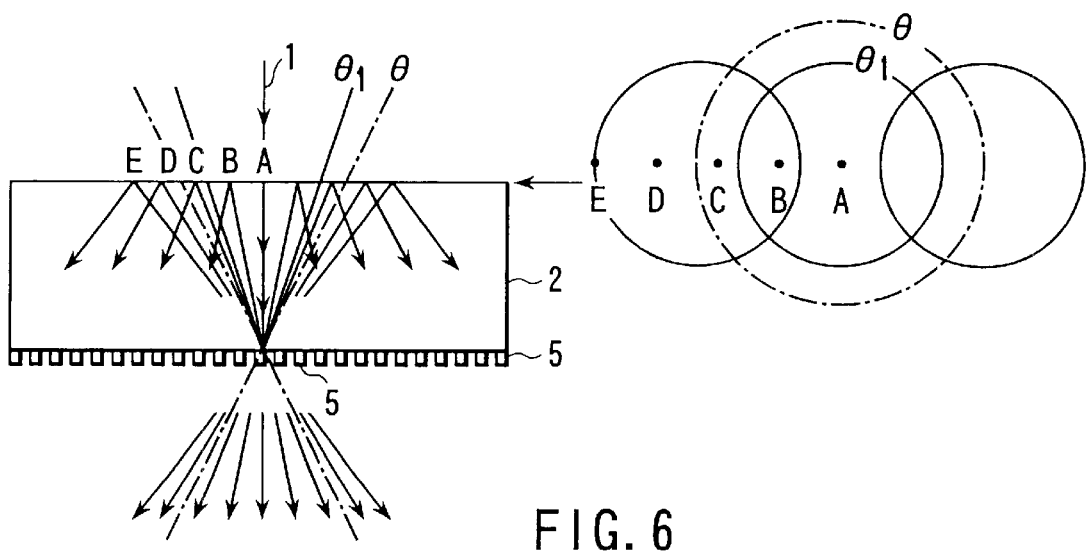
FIG. 6 schematically shows the reflection and diffraction within the photomask when the periodic pattern is formed.

FIG. 6 shows the reflection and diffraction inside the photomask 2 when the periodic pattern 5 is formed.

The illumination light 1 is transmitted through and diffracted by the patterned surface of the photomask 2 and, at the same time, generates a reflected diffraction light. The distribution of the reflected diffraction light on the back surface of the photomask 2, i.e., the surface opposite to the surface on which the periodic pattern 5 is formed, is similar to the diffracted light distribution on the pupil 6. However, the intensity ratio among the diffracted lights is not necessarily equal to that among the transmitted diffraction lights. These reflected diffraction lights are reflected again from the back surface of the photomask 2, and the re-reflected lights illuminate again the pattern in the neighborhood.

Since the incident angle is smaller than $\theta_1$ at the time when the reflected diffraction lights, which are reflected at points A and B, perform again the illuminating function, the image forming characteristics are not affected. On the other hand, since the incident angle is larger than $\theta_1$ at the time when the reflected diffraction light, which is reflected at point C, performs again the illuminating function, the illumination has a value of σ that is larger than the illumination coherency σ. However, since the value of σ is smaller than θp', the illumination remains to be a bright-field illumination. It follows that the influence given to the image formation is small. However, the incident angle is larger than θp' at the time when the reflected diffraction lights, which are reflected at points D and E, perform again the illuminating function, with the result that the illumination is a dark-field illumination.

Incidentally, in schematically depicting the particular phenomenon, the refraction of light is neglected for facilitating the understanding. Originally, the optical path of the light ray passing through a medium having a refractive coefficient n differs from that of the light ray passing through vacuum or the air atmosphere as taught by Snell laws of refraction. In the drawing, however, the angle of the light ray passing through a medium having a refractive coefficient n is depicted to be equal to that within the air atmosphere. Therefore, for determining the actual angle of the light ray passing through the medium, required is calculation based on the Snell laws of refraction. It should be noted that the incident angle within the medium shown in the drawing represents the angle of emission to the light exposure atmosphere (within the air atmosphere).

The difference between the change in the light intensity distribution caused by the flare and the change in the light intensity distribution owing to the dark-field illumination will now be described.

Figure 7:
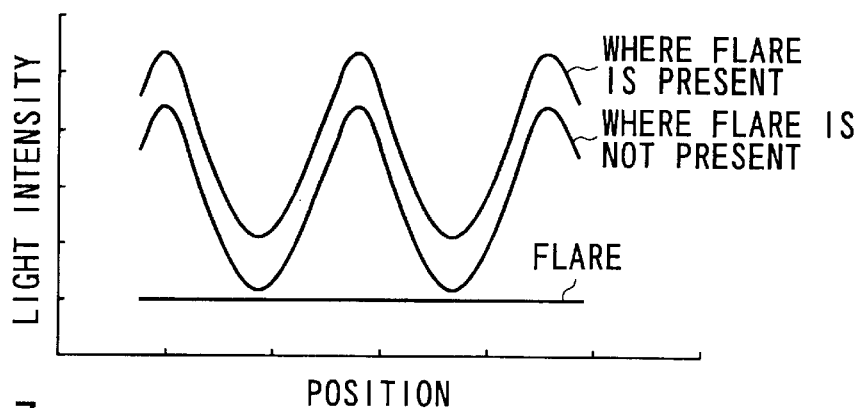
FIG. 7 is a graph showing the change in the light intensity distribution on the resist caused by the flare.
Figure 8:
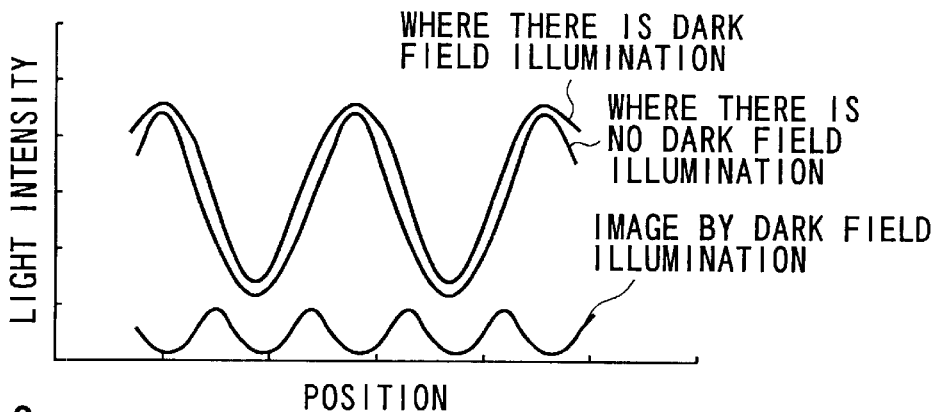
FIG. 8 is a graph showing the change in the light intensity distribution caused by the dark-field illumination effect.

FIG. 7 shows the change in the light intensity distribution on the resist on a wafer caused by the flare, with FIG. 8 showing the change in the light intensity distribution of the resist on a wafer caused by the dark-field illumination effect. As apparent from FIG. 7, the shape of the light intensity distribution is not changed by the presence of the flare, though the entire distribution is shifted by the presence of the flare. This is considered to support that the presence of the flare simply boosts uniformly the light intensity. On the other hand, FIG. 8 is considered to support that, since the period of forming an image by the dark-field illumination is ½ of the period of the dark-field illumination, the presence of the dark-field illumination thickens the light intensity distribution on the resist.

Figure 9A:
FIGS. 9A, 9B and 9C are cross sectional views showing the change in the cross sectional profile accompanying the change in the light intensity distribution.
Figure 9B:
Figure 9C:

FIGS. 9A, 9B and 9C show the results of experiments conducted by the present inventors in an attempt to confirm the difference in the cross sectional profile of the resist film accompanying the change in the light intensity distribution.

Specifically, FIG. 9A shows the cross sectional profile of a resist pattern 10 in the case where the light exposure was performed by using a photomask having the peripheral portion of the pattern covered with an opaque film and, thus, having a large covering ratio. Since the tuning of the resist process is performed by using a photomask, the resist pattern 10 basically has a rectangular cross sectional profile having angular corners. However, the cross sectional profile was actually found to be somewhat inversely tapered shape.

FIG. 9B shows the cross sectional profile of the resist pattern 10, covering the case where the amount of the flare was seemingly boosted by performing a light exposure with a exposure Dose of about 5% and without using a photomask, followed by performing a light exposure by using a photomask. The photomask used in this case was equal to the photomask used in conjunction with FIG. 9A. The focus and exposure Dose latitude for FIG. 9B was lowered, compared with that for FIG. 9A. However, no difference was recognized between the two in the cross sectional profile of the resist pattern.

Further, FIG. 9C shows the cross sectional profile of the resist pattern 10, covering the case where the light exposure was performed by using a photomask having a periodic pattern arranged on the entire surface and having a small covering ratio. The focus and exposure Dose latitude for FIG. 9C was lowered, compared with that for FIG. 9A. In addition, the cross sectional profile of the resist pattern was found to be roundish in the corner portions. As described above, the change in the cross sectional profile of the resist shown in FIG. 9C is clearly caused by the dark-field illumination effect.

First Embodiment

A photomask according to a first embodiment of the present invention will now be described after description of the conventional photomask in which an antireflection treatment is not applied to the back surface. The light exposure apparatus used for the light exposure is a scanner using as a light source a KrF excimer laser light having a reduction rate of ¼ and NA of 0.68.

Figure 10:
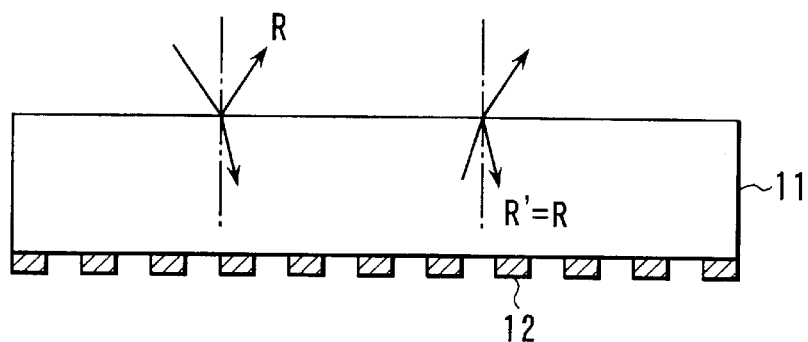
FIG. 10 is a cross sectional view showing a conventional photomask used in the lithography process.

FIG. 10 is a cross sectional view showing a conventional photomask used in the lithography process. The conventional photomask comprises a quartz glass substrate 11 and a periodic pattern 12. The quartz substrate 11 is transparent to the exposed light. The pattern 12, which is formed on the front surface (first main surface) of the transparent substrate 11, is formed of an opaque film.

The transparent substrate 11 has a refractive coefficient $n_s$ of 1.51 relative to the KrF excimer laser light. The reflectance of the KrF excimer laser light at the interface between the transparent substrate 11 and the light exposure atmosphere (air atmosphere) is about 4% within a range of the incident angle of between 0° and 20°.

Figure 11:
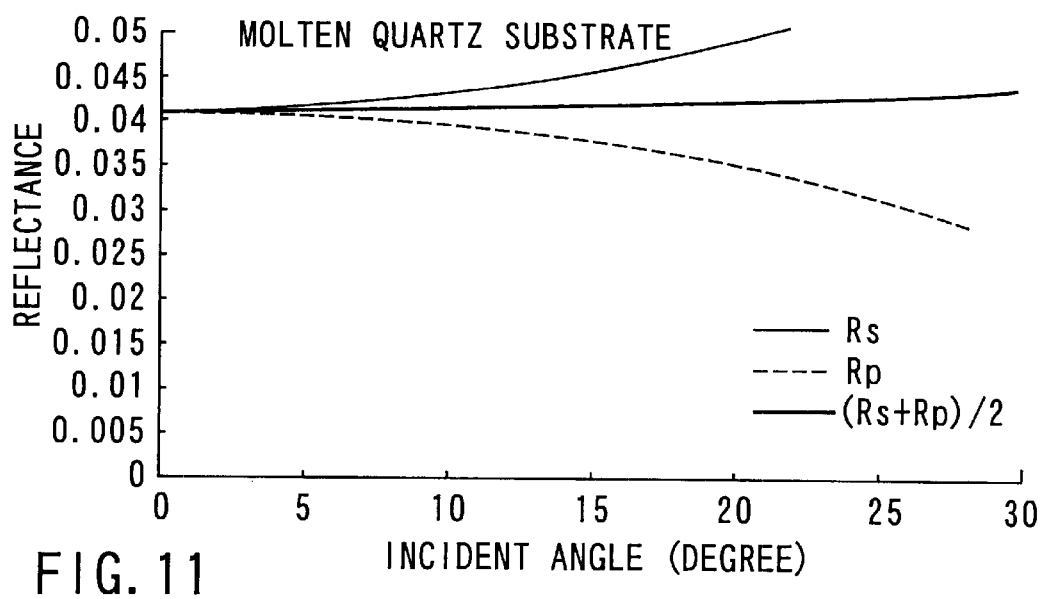
FIG. 11 is a graph showing the relationship between the incident angle of a KrF excimer laser light on a quartz glass substrate and the reflectance.

Incidentally, the reflectance R of the light ray incident from the light exposure atmosphere (air atmosphere) on the transparent substrate 11 with an incident angle θ and the reflectance R' (see FIG. 10) of the light ray emitted from within the transparent substrate 11 into the light exposure atmosphere (air atmosphere) with an emitting angle θ are strictly equal to each other even in the case of forming an antireflection coating, if the extinction coefficient of the antireflection coating is zero. Therefore, shown in FIG. 11 is the reflectance of the light ray incident from the exposure atmosphere onto the transparent substrate 11 with an incident angle θ. Also, curves Rs and Rp shown in FIG. 11 represent the vertical component and the horizontal component, respectively, in respect of the incident plane of the KrF excimer layer light.

Figure 12:
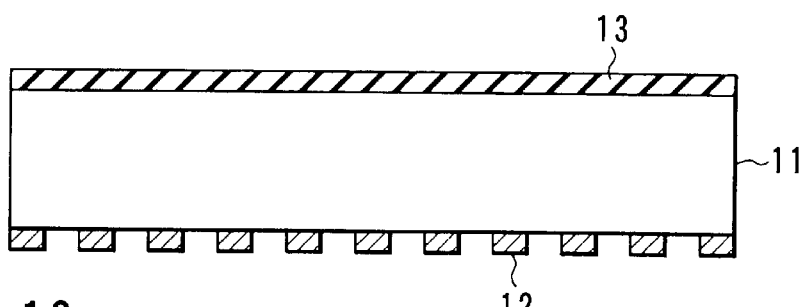
FIG. 12 is a cross sectional view showing a photomask according to a first embodiment of the present invention.

FIG. 12 is a cross sectional view showing a photomask according to the first embodiment of the present invention. The photomask shown in FIG. 12 differs from the conventional photomask shown in FIG. 10 in that a calcium fluoride (fluorite) thin film 13 is formed on the back surface (second main surface) of the transparent substrate 11 as an antireflection coating of a single layer structure. The calcium fluoride thin film 13 is formed by, for example, a vapor deposition.

The refractive coefficient n of the calcium fluoride thin film 13 relative to the KrF excimer layer light having a wavelength λ of 0.248 μm was measured by an experiment conducted separately and found to be 1.24 (n=1.24). Also, the angle corresponding to NA on the upstream side of the light exposure apparatus was about 10°. Further, since the expected greatest emitting angle of the reflected primary diffraction light is 15°, the thickness of the calcium fluoride thin film 13 was chosen to be 0.052 μm so as to minimize the reflectance within the incident angle ranging between 10° and 15°.

Figure 13:
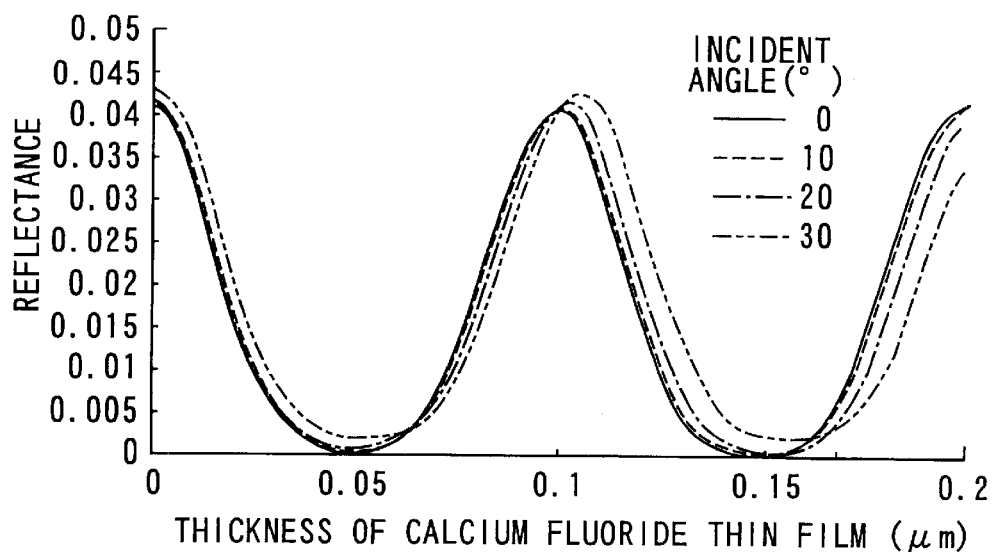
FIG. 13 is a graph showing the relationship between the thickness of a calcium fluoride thin film formed on the back surface of a transparent substrate and the reflectance of a KrF excimer laser light.

FIG. 13 shows the relationship between the thickness of the calcium fluoride thin film 13 formed on the back surface of the transparent substrate 11 and the reflectance of the KrF excimer laser light.

The reflectance of the excimer laser light is about 0.4% in the case of using the photomask of the present invention having the back surface of the transparent substrate 11 covered with the calcium fluoride thin film 13. Further, it is seen that the reflectance is periodically change relative to the thickness of the calcium fluoride thin film. However, the difference in the optimum film thickness between the perpendicular incident light (θ=0°) and the oblique incident light (θ=20°) is increased with increase in the period.

On the other hand, the reflectance of th KrF excimer laser light is about 4% in the case of using a conventional photomask not having the back surface of the transparent substrate 11 covered with the calcium fluoride thin film 13, as shown in FIG. 11.

The results of the light exposure experiments using the photomasks shown in FIGS. 10 and 12 are as follows. Specifically, in the light exposure using the conventional photomask shown in FIG. 10, which did not include a calcium fluoride thin film, the cross section profile of the resist was roundish on the top portion. In the light exposure using the photomask of the present invention shown in FIG. 12, which included the calcium fluoride thin film, however, the cross section profile of the resist was found to be substantially rectangular.

It should be noted, however, that calcium fluoride is highly costly and has a thermal expansion coefficient about 30 times as high as that of the molten quartz used as the substrate material. In addition, calcium fluoride is deliquescent. In other words, calcium fluoride absorbs moisture within the air so as to be melted. Under the circumstances, some improvement is required for using calcium fluoride for forming an antireflection coating of a photomask. For example, in order to put calcium fluoride to a practical use, it is desirable to use additives for lowering the thermal expansion coefficient of calcium fluoride.

Figure 14:
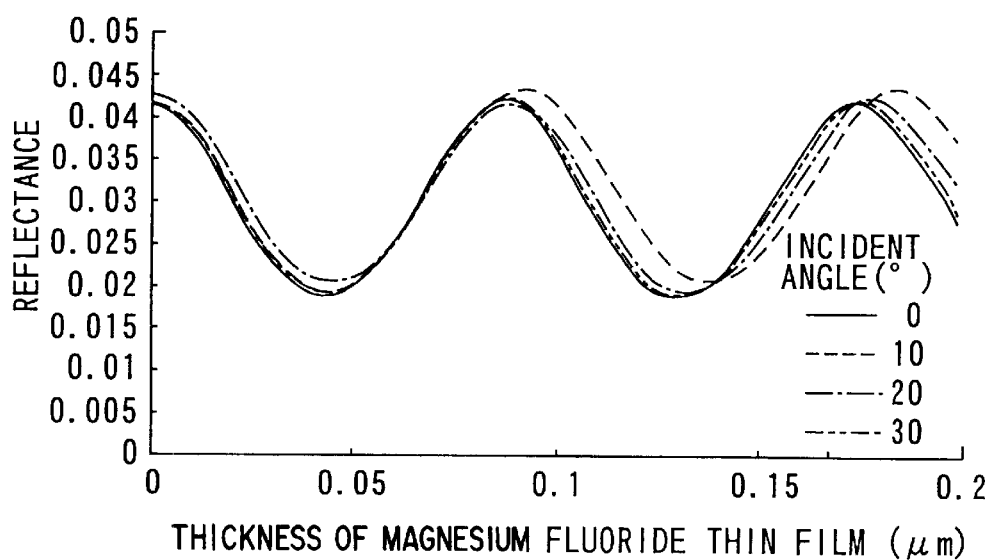
FIG. 14 is a graph showing the relationship between the thickness of a magnesium fluoride thin film formed on the back surface of a transparent substrate and the reflectance of a KrF excimer laser light.

Magnesium fluoride is most generally used for forming an antireflection coating. FIG. 14 is a graph showing the relationship between the thickness of a magnesium fluoride thin film of a single layer structure formed on the back surface of the transparent substrate 11 and the reflectance of the KrF excimer laser light. As apparent from the graph of FIG. 14, the reflectance of the KrF excimer laser light can be decreased from 4% to only 2%. Clearly, the magnesium fluoride thin film is incapable of producing a sufficient antireflection effect.

Incidentally, a photomask capable of producing a sufficient antireflection effect by using a readily available material such as magnesium fluoride will be described herein later in conjunction with a second embodiment of the present invention, i.e., a photomask provided with an antireflection coating of a multi-layered structure.

The ideal refractive coefficient of an antireflection coating of a single layer structure is: $(n_s)^{1/2}=1.22$. On the other hand, the refractive coefficient of calcium fluoride is 1.24, which is close to the ideal value noted above. On the other hand, the refractive coefficient of magnesium fluoride is 1.41. The difference in the refractive coefficient is considered to bring about the difference in the reflectance.

As described above, according to the first embodiment of the present invention, the back surface of the transparent substrate is covered with a calcium fluoride thin film so as to permit the back surface of the photomask to exhibit a very high antireflection effect, with the result that it is possible to prevent the dark-field illumination effect caused by the re-reflection of the exposed light from the back surface of the photomask. As a result, it is possible to overcome the problem such as the difference in the cross sectional profile of the resist caused by the difference in the pattern periphery portion of the photomask so as to make it possible to construct a uniform resist process.

Second Embodiment

Figure 15:
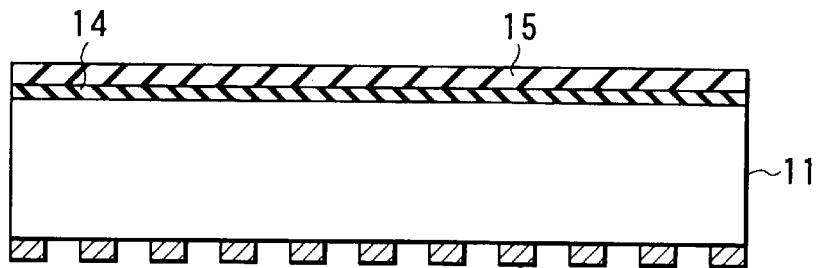
FIG. 15 is a cross sectional view showing a photomask according to a second embodiment of the present invention.

FIG. 15 is a cross sectional view showing a photomask according to a second embodiment of the present invention. Incidentally, the same members of the photomask are denoted by the same reference numerals throughout various embodiments described herein so as to avoid an overlapping description.

The second embodiment differs from the first embodiment described above in that, in the second embodiment, the back surface of the transparent substrate 11 is covered with an antireflection coating of a laminate structure consisting of a magnesium oxide thin film 14 and a magnesium fluoride thin film 15. The magnesium oxide thin film 14 has a large refractive coefficient $n_{f1}$. On the other hand, the magnesium fluoride thin film 15 has a small refractive coefficient $n_{f2}$. Magnesium oxide and magnesium fluoride forming these thin films 14 and 15, respectively, can be handled easily, compared with calcium fluoride.

The refractive coefficient of each of the magnesium oxide thin film and the magnesium fluoride thin film relative to the KrF excimer laser light was measured by experiments conducted separately and found to be 1.75 for the magnesium oxide thin film and 1.41 for the magnesium fluoride thin film. Each of these thin films 14 and 15 is formed by vapor deposition. These magnesium oxide thin film and magnesium fluoride thin film are formed in a thickness of 30 nm ad 45 nm, respectively.

Figure 16:
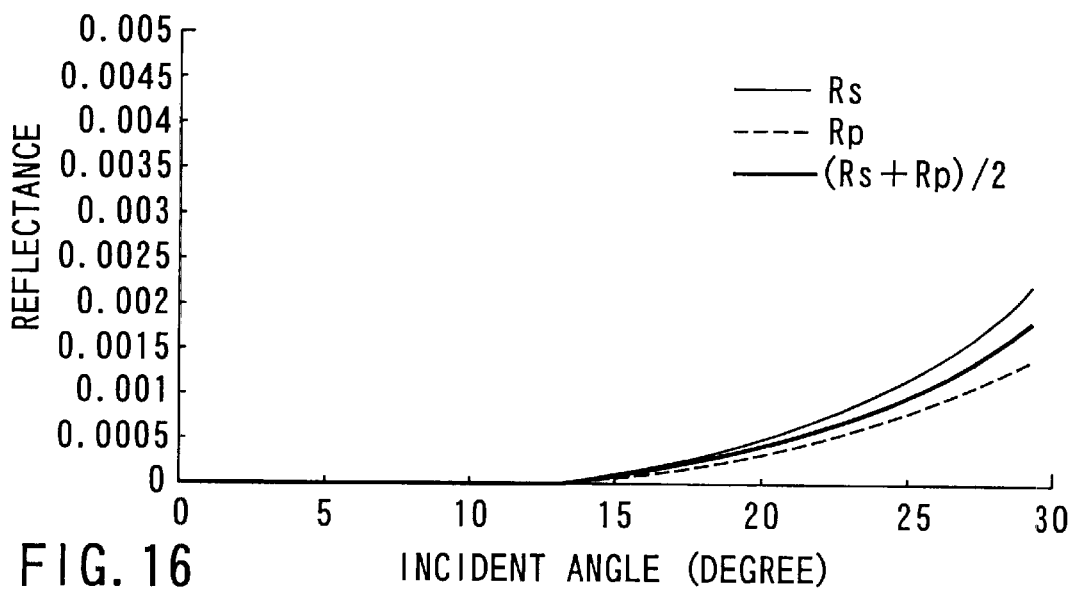
FIG. 16 is a graph showing the relationship between the incident angle of a KrF excimer laser light and the reflectance, covering the case where the back surface of a transparent substrate is covered with a laminate structure consisting of a magnesium oxide thin film and a magnesium fluoride thin film.

FIG. 16 is a graph showing the relationship between the reflectance and the incident angle, which are obtained by calculation using the values noted above. As apparent from FIG. 16, the reflectance within the incident angle ranging between 10° and 15° is not higher than 0.01%, supporting that a high antireflection effect can be expected within the range of the incident angle noted above. Particularly, the combination of the thin film materials used in the second embodiment meets the relationship set forth in formula (1) given below:

$$n_{f1} \geq n_{f2} \times (n_s)^{1/2} \quad (1)$$

where $n_s$ represents the refractive coefficient of the quarts substrate.

In other words, $1.75 > 1.41 \times (1.51)^{1/2} = 1.72$

The combination of the materials meeting this condition permits decreasing the reflectance to substantially zero by suitably selecting the film thickness.

According to the light exposure experiment conducted by using the photomask according to the second embodiment of the present invention shown in FIG. 15, the cross section profile of the resist was found to be substantially rectangular, as in the light exposure experiment using the photomask according to the first embodiment of the present invention shown in FIG. 12.

In the second embodiment described above, employed was a combination of a magnesium oxide thin film and a magnesium fluoride thin film. However, the present invention is not limited to the particular combination. It is possible to employ any combination of thin films low in absorption as far as a first thin film containing as a main component a material having a large refractive coefficient is formed on a transparent substrate and a second thin film containing as a main component a material having a small refractive coefficient is formed on the first thin film.

Third Embodiment

Figure 17:
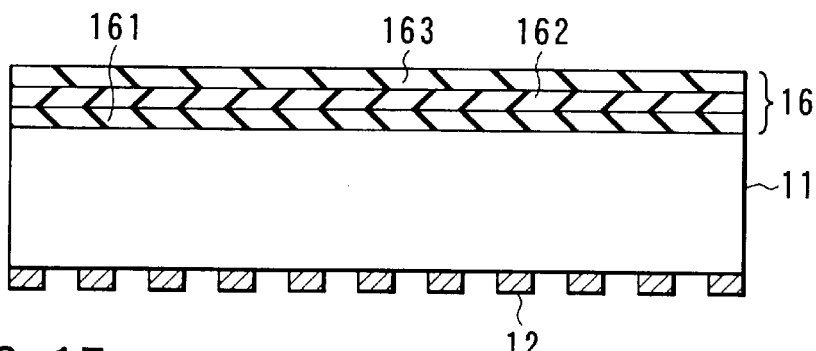
FIG. 17 is a cross sectional view showing a photomask according to a third embodiment of the present invention.

FIG. 17 is a cross sectional view showing a photomask according to a third embodiment of the present invention.

Figure 18:
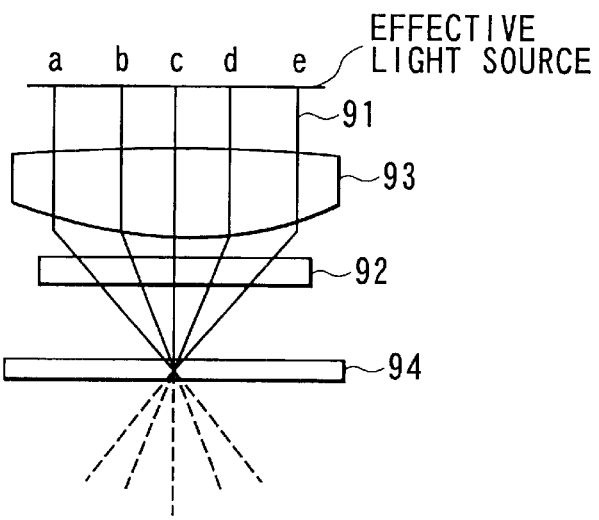
FIG. 18 schematically shows the situation of the light exposure in the case of using a conventional multi-layered thin film (thin film interference filter)

In an antireflection coating of a laminate structure, the width of selection of the materials that are expected to produce a high antireflection effect is increased with increase in the number of layers forming the laminate structure. Therefore, it is possible for the antireflection coating of a laminate structure to provide an effective antireflection coating relative to the lithography in which the wavelength is expected to be made shorter and shorter in the future. However, the incident angle on the optical path of an exposing light 91 as shown in FIG. 18 so as to substantially realize an obliquely incident annular band-like illumination. A reference numeral 93 shown in the drawing denotes an illumination optical system, and a reference numeral 94 denotes a mask.

The multiple interference film 92 seemingly resembles the antireflection coating 16 of the multi-layered structure included in the photomask of the present invention shown in FIG. 17. However, in order to enable the antireflection coating 16 of the present invention to realize the incident angle dependency of the multi-layered interference film 92, it is necessary to use a thin film of a multi-layered structure including at least scores of layers. In other words, it may be certainly possible for the antireflection coating of a laminate structure, which is proposed in the present invention and includes not more than 10 layers, to produce a sufficient antireflection effect. However, it is impossible for the antireflection coating proposed in the present invention to realize the incident angle dependency, which is an effect produced by the multiple interference film 92.

The prior art quoted above, i.e., Japanese Patent Disclosure No. 7-211617, also discloses the incident angle characteristics of the multi-layered thin film 92 in the case of using an i-line light exposure apparatus the dependence of the antireflection effect on the incident angle tends to be narrowed with increase in the number of layers forming the laminate structure. Such being the situation, an antireflection coating of a laminate structure consisting of 10 layers or more is not practical.

The photomask according to the third embodiment of the present invention, which is shown in FIG. 17, is featured in that the back surface of the transparent substrate 11 is covered with an antireflection coating 16 of a three-layer structure consisting of a first thin film 161, a second thin film 162 and a third thin film 163. It is possible to design the particular photomask such that the reflectance can be suppressed to 0.1% or less by the first to third thin films 161 to 163.

It is possible for the material of the first thin film 161 to be equal to or different from the material of the third thin film 163. However, in order to suppress effectively the reflectance, it is desirable to select the materials of the first to third thin films 161 to 163 such that the refractive coefficient of the second thin film 162 is larger than that of each of the first and third thin films 161, 163.

Figure 19:
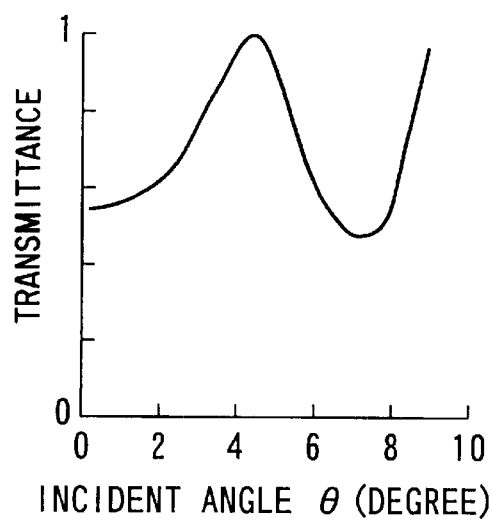
FIG. 19 is a graph showing the incident angle characteristics of the multi-layered thin film (thin film interference film) shown in FIG. 18.

Incidentally, it is proposed in, for example, Japanese Patent Disclosure (Kokai) No. 7-211617 to arrange a multiple interference film 92 dependent on having NA of 0.5 and σ of 0.7, as shown in FIG. 19. As apparent from FIG. 19, the multi-layered thin film 92 exhibits the highest transmittance at an incident angle of about 4.0°, and the transmittance is sufficiently lowered at the incident angle of about 6.0°. In this case, $\theta_1$ is about 4.0°, and $\theta p'$ is about 5.7°. On the other hand, the antireflection characteristics realized in the present invention are featured in that the reflectance can be suppressed in a region in which the incident angle if larger than $\theta p'$ ($>\theta_1$). Naturally, the present invention quite differs from the prior art quoted above.

Fourth Embodiment

Figure 21:
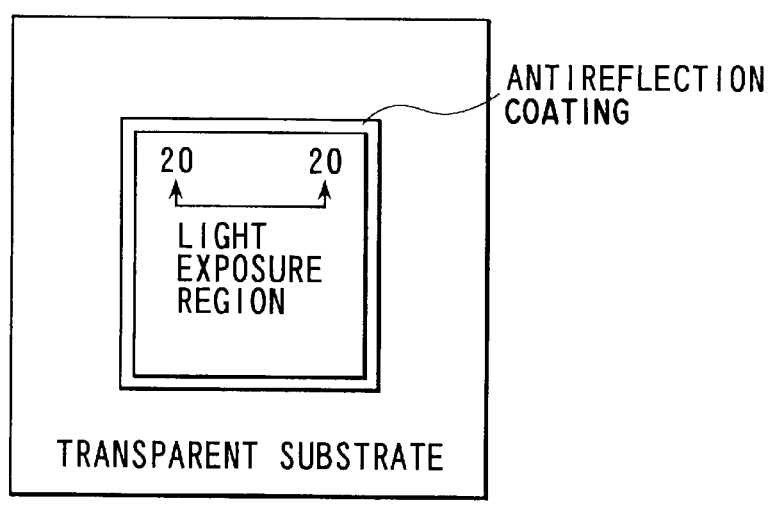
FIG. 21 is a plan view showing the photomask blank shown in FIGS. 20A to 20G.

FIGS. 20A to 20G are cross sectional views along the line 20—20 shown in FIG. 21, which is a plan view, showing several photomask blanks according to a fourth embodiment of the present invention. In these drawings, a reference numeral 17 denotes an opaque film, reference numerals 18 and 19 denote antireflection coatings, reference numerals 20 and 21 denote translucent films, and reference numerals 22 and 23 denote phase shift films.

That portion of the transparent substrate which is positioned outside the antireflection coating forms a holding position when a photomask blank is held by a holder. The photomask blank comprises a magnesium oxide thin film 14 having a thickness of 30 nm and a magnesium fluoride thin film 15 having a thickness of 50 nm. The photomask blank also comprises an opaque film 17, antireflection coatings 18, 19, translucent films 20, 21, and phase shift films 22, 23. The thickness of each of these films is determined appropriately depending on the material of each of these films and the kind of the blank.

Figure 20A:
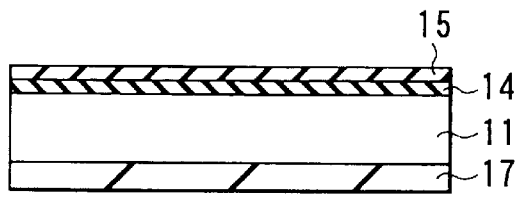
FIGS. 20A, 20B, 20C, 20D, 20E, 20F and 20G are cross sectional views showing photomask blanks according to a fourth embodiment of the present invention.
Figure 20B:
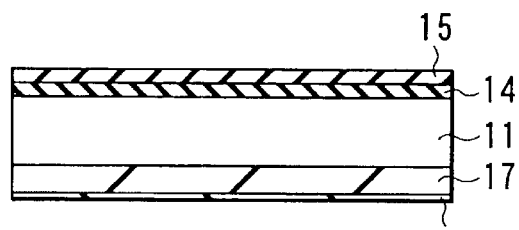
Figure 20C:
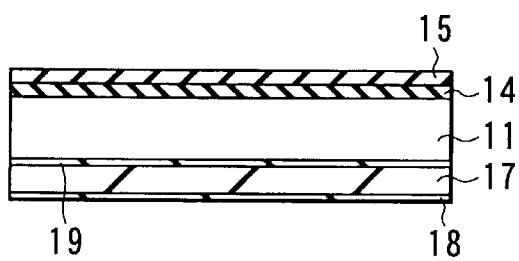

FIGS. 20A to 20C show a photomask blank corresponding to a binary mask. The opaque film 17 is formed of Cr, MoSi or the like. The antireflection coating 18 shown in FIG. 20B serves to suppress the reflection from the interface between the opaque film 17 and the light exposure atmosphere (the air atmosphere). The antireflection coatings 18, 19 shown in FIG. 20C serve to suppress the reflection from the interface noted above and from the interface between the opaque film 17 and the transparent substrate 11. Each of these antireflection coatings 18 and 19 is formed of, for example, $CrO_x$. It is possible for these antireflection coatings 18 and 19 to be formed of the same material or different materials.

Figure 20D:
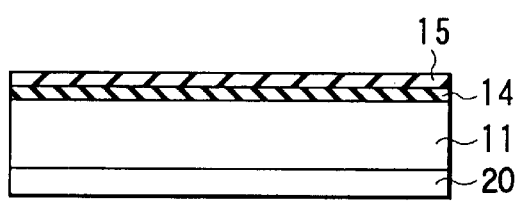
Figure 20E:
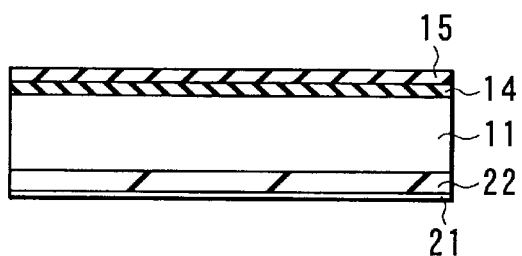
Figure 20F:
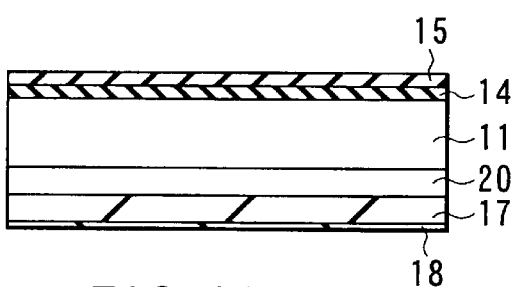

FIGS. 20D to 20F show a photomask blank corresponding to a phase shift mask of an attenuated type. The translucent film 20 has a transmittance of several % and has the phase controlled. The material of the translucent film 20 includes, for example, MoSi, $MoSi_xO_yN_2$, $SiN_x$ and $CrF_x$. Particularly, the photomask blank shown in FIG. 20E is of the type that the translucent function (main function) and the phase control function (auxiliary function) of the translucent film 20 are performed by different films 21, 22, respectively. To be more specific, the translucent film 21 performs the translucent function, and the phase shift film 22 performs the phase control function.

Figure 20G:
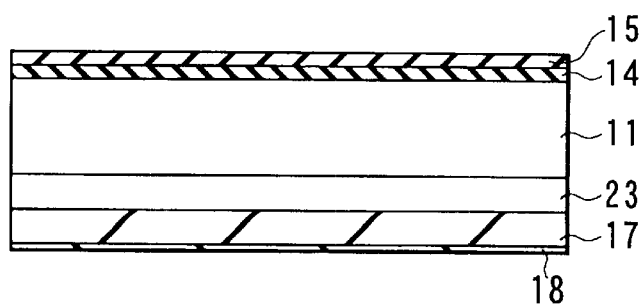

Further, FIG. 20G shows a photomask blank corresponding to a phase shift mask of an alternating type. The phase shift film 23 is formed of, for example, $SiO_2$.

The manufacturing method of the photomask blanks shown in FIGS. 20A to 20G are basically equal to the conventional method except the step of forming the antireflection coating of a two-layer structure. For example, in the manufacturing method of the photomask blank shown in FIG. 20A, a first thin film constituting the opaque film 17 is formed first on the surface of the transparent substrate 11 by a sputtering method or, preferably, by a vapor deposition method. Then, the first thin film is etched to form the opaque film 17 having a predetermined shape. After formation of the opaque film 17, the magnesium oxide thin film 14 and the magnesium fluoride thin film 15 are formed successively on the back surface of the transparent substrate 11 by a sputtering method. Finally, these thin films 14 and 15 are etched so as to form an antireflection coating of a laminate structure having a predetermined shape. The other photomask blanks shown in FIGS. 20B to 20G can also be manufactured similarly by a method substantially equal to the method described above.

For manufacturing a photomask from the photomask blank shown in FIG. 20A, it suffices to pattern the opaque film 17 by employing a lithography and etching. A photomask can also be prepared similarly from each of the photomask blanks shown in FIGS. 20B to 20G.

Each of the photomask blanks shown in FIGS. 20A to 20G comprises an antireflection coating of a two-layer structure consisting of the magnesium oxide thin film 14 and the magnesium fluoride thin film 15. Alternatively, it is possible for the antireflection coating to be of a laminate structure including at least three layers or to be of a single layer structure consisting of a calcium fluoride thin film alone.

It is possible to modify the photomask blanks shown in FIGS. 20A to 20G such that a resist film is formed on the side of the opaque film. When it comes to the photomask blank shown in, for example, FIG. 20A, it is possible to form a resist film on the surface of the opaque film 17. Further, when it comes to the photomask blank shown in each of FIGS. 20B and 20C, it is possible to form a resist film on the surface of the antireflection coating 18.

Fifth Embodiment

How to apply a light exposure treatment to a semiconductor wafer by using a photomask of the present invention will now be described as a fifth embodiment of the present invention.

Figure 22:
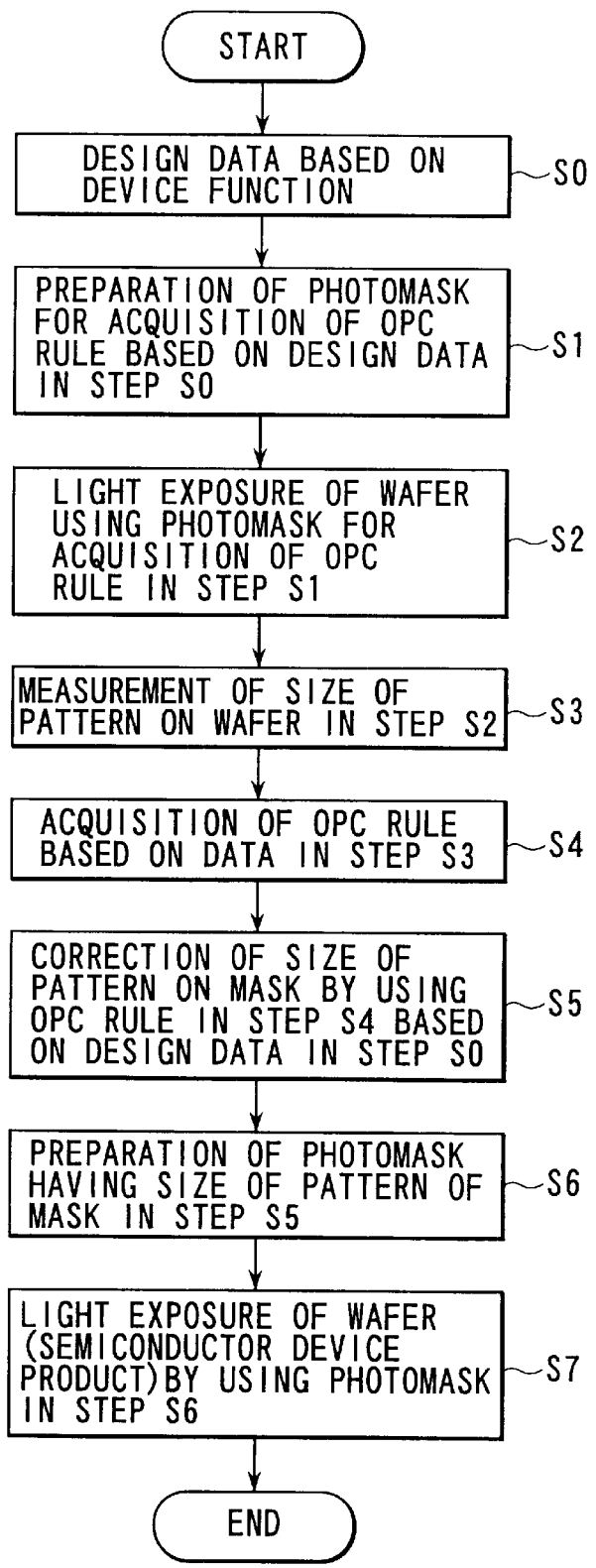
FIG. 22 is a flow chart showing the light exposure method of a semiconductor wafer using a photomask according to a fifth embodiment of the present invention.
Figure 23A:
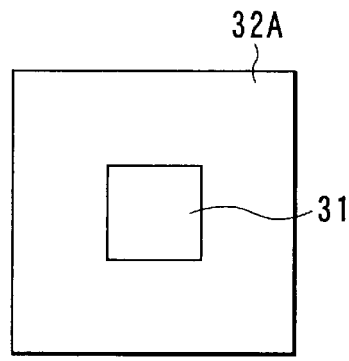
FIGS. 23A, 23B, 23C, 23D, 23E and 23F are plan views of photomasks for acquiring the OPC rule.
Figure 23B:
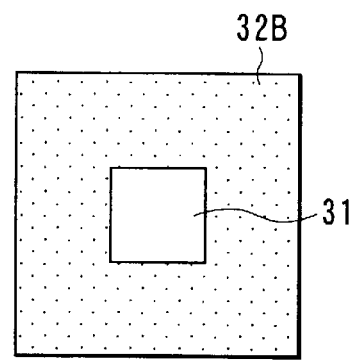
Figure 23C:
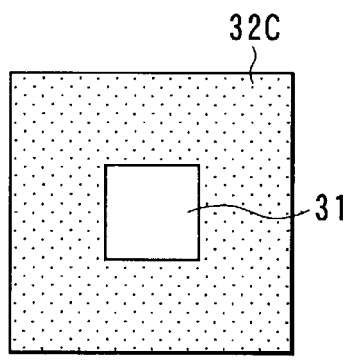
Figure 23D:
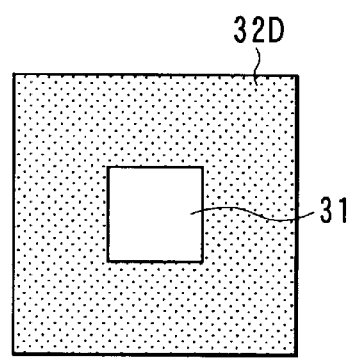
Figure 23E:
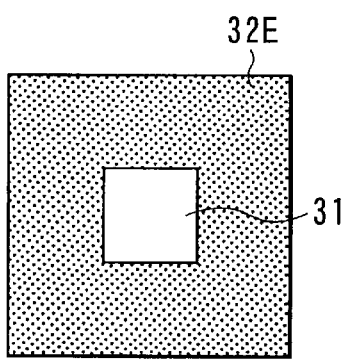
Figure 23F:
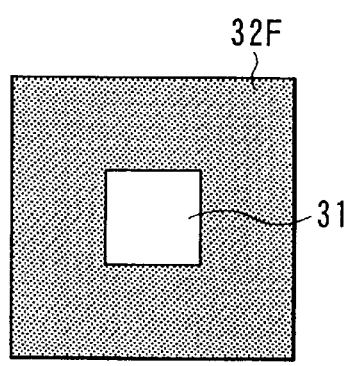

FIG. 22 is a flow chart showing how to apply a light exposure treatment to a semiconductor wafer by using a photomask according to a fifth embodiment of the present invention.

First of all, design data are calculated in step S0 on the basis of the device function. Then, in step S1, prepared is a photomask for acquisition of the optical proximity effect correction (OPC) rule on the basis of the design data calculated in step S0. The photomask prepared is a photomask defined in the present invention, which includes an antireflection coating formed on a second main surface (back surface) opposite to a first main surface on which are formed an opaque film, etc.

In step S2, performed is a light exposure for patterning a thin film on the wafer by using the photomask for acquisition of the OPC rule noted above, followed by measuring in step S3 the size of the pattern on the wafer, which is formed by the light exposure in step S2. In step S4, the OPC rule is acquired on the basis of the data measured in step S3.

Then, in step S5, the size of a pattern on the mask is corrected by using the OPC rule acquired in step S4 so as to obtain a pattern satisfying the design data calculated in step S0 on the wafer, followed by preparing in step S6 a photomask having the size of the pattern corrected in step S5. The photomask prepared is a photomask of the present invention, which includes an antireflection coating formed on the second main surface opposite to the first main surface on which are formed the opaque film, etc. Then, in step S7, a semiconductor device (product) is manufactured by applying a light exposure treatment to the wafer by using the photomask prepared in step S6, thereby finishing the light exposure treatment applied for manufacturing a semiconductor device.

The measurement of the size of the pattern in step S3 is performed by using a size measuring apparatus such as CD-SEM. Incidentally, it is also possible to prepare a pattern for evaluation by applying an etching treatment such as a RIE treatment, and to measure the electrical characteristics (current value and voltage value) of the pattern for the evaluation so as to obtain the size of the pattern.

A plurality of light exposure areas each having a predetermined size are formed by a stepper on the entire wafer surface. The light exposed area noted above is called shot. For example, 20 shots are formed on a single wafer. Since the number of measuring points of the pattern (the number of OPC data) is about 20 to 25 points per shot, the number of measuring points on single wafer having 20 shots is 400 to 500. It is possible to prepare a plurality of wafers, if necessary, so as to increase the number of shots to about 20 to 100.

In such a light exposure method of the semiconductor wafer, the photomask of the present invention having an antireflection coating formed on the second main surface (back surface) is used as the photomask prepared in step S1 so as to improve the working efficiency for acquiring the OPC rule in steps S1 to S4.

Where the OPC rule is acquired by using the conventional photomask, it was necessary to prepare about 3 to 10 levels of the patterns for acquiring the OPC rule differing from each other in the covering ratio of the peripheral pattern as shown in FIGS. 23A, 23B, 23C, 23D, 23E and 23F and to acquire the OPC rule for each covering ratio because the OPC rule differs depending on the covering ratio of the opaque film, etc., i.e., because the OPC rule is dependent on the covering ratio.

FIGS. 23A to 23F noted above are plan views showing photomasks for acquiring the OPC rule. The photomask comprises a region 31 in which a pattern whose size is to be measured is formed and regions 32A, 32B, 32C, 32D, 32E and 32F, which are present in the peripheral portion of the region 31 and in which the peripheral pattern is formed. The regions 32A, 32B, 32C, 32D, 32E and 32F differ from each other in the covering ratio of the peripheral pattern. The photomasks shown in FIGS. 23A to 23F differ from each other in the covering ratio of the peripheral pattern and are used for acquiring the OPC rule.

In the present invention, the dependency of the OPC rule on the covering ratio can be lowered because the photomask used in the present invention has an antireflection coating formed on the back surface, with the result that it suffices to acquire the OPC rule by using a pattern for acquiring the OPC having a single kind of the covering ratio of the peripheral pattern. This is advantageous in the manufacturing method of a semiconductor device which requires a large number of light exposure steps applied to the semiconductor wafer.

It should also be noted that a photomask having an antireflection coating formed on the second main surface (back surface), which is a photomask of the present invention, is prepared in step S7, making it possible to carry out the light exposure treatment that is not affected by the difference in the covering ratio of the opaque film, etc.

The present invention is not limited to the first to fifth embodiments described above. For example, in the embodiments described above, a KrF laser beam is used as the exposed light. Alternatively, it is also possible in the present invention to use, for example, an ArF laser beam or an $F_2$ laser beam as the exposed light treatment. Further, the present invention can be modified in various fashions within the technical scope of the present invention.

The other embodiments of the present invention and the produced effects will now be described.

Among the photomasks used for the manufacture of a DRAM, a photomask having an antireflection coating consisting of a first thin film and a second thin film formed on the second main surface (back surface) is used in a layer called a critical layer having a narrow exposure focus latitude of the lithography. The first and second thin films noted above meet the relationship $n_{f1} \geq n_{f2} \times n_s^{1/2}$, where $n_s$ represents the refractive coefficient of the transparent substrate relative to the wavelength of the exposed light, $n_{f1}$ represents the refractive coefficient of the first thin film formed on the transparent substrate, and $n_{f2}$ represents the refractive coefficient of the second thin film formed on the first thin film.

To be more specific, the photomask defined in the present invention is used in the gate layer or a bit line layer, which is formed of a dense line/space (L/S) pattern and a sparse line or space pattern. In the case of using a positive resist, the average covering ratio of the photomask is about 30% for the gate layer and about 70% for the bit line layer.

In the case of using a conventional photomask, in which an antireflection coating is not formed on the back surface, the gate layer and the bit line layer differ from each other in the cross sectional profile of the resist and in the light exposure latitude even within the range in which the optical proximity effect is exerted and under the same pattern arrangement on the photomask, with the result that the cross sectional profile of the gate layer was made somewhat roundish in the head portion. Such being the situation, an exposure latitude substantially equal to that for the bit line layer and a cross sectional profile of the resist close to a rectangular cross sectional profile were obtained in the gate layer by changing the developing conditions.

On the other hand, in the case of using a photomask including an antireflection coating consisting of the first and second thin films, it has been found possible to obtain an exposure latitude and a cross sectional profile of the resist close to a rectangular cross sectional profile for each of the gate layer and the bit line layer without changing the resist process.

Also, in the present invention, a photomask having an antireflection coating consisting of the first and second thin films formed on the second main surface (back surface) is used as a photomask for acquiring the rule data for the optical proximity effect correction (OPC) and as a photomask for manufacturing a semiconductor device corrected by the rule noted above. The first and second thin films noted above meet the relationship $n_{f1} \geq n_{f2} \times n_s^{1/2}$, where $n_s$ represents the refractive coefficient of the transparent substrate relative to the wavelength of the exposed light, $n_{f1}$ represents the refractive coefficient of the first thin film formed on the transparent substrate, and $n_{f2}$ represents the refractive coefficient of the second thin film formed on the first thin film.

In the case of using a conventional photomask, in which an antireflection coating is not formed on the back surface, as a mask for acquiring the OPC rule data, the obtained OPC rule data were very large in the nonuniformity depending on the positions within the mask. Also, a photomask used for the manufacture of a semiconductor device was prepared by performing correction on the basis of the OPC rule data. However, it was impossible to obtain a sufficient correcting effect. In order to obtain a sufficient correcting effect, it was necessary to use OPC correction rules differing from each other depending on the covering ratio and positions on the photomask by using a mask for acquiring the OPC rule data having the construction very close to that of the photomask used for the manufacture of a semiconductor device. As a result, the rule acquisition was rendered more troublesome so as to increase the preparation time and the preparation cost of the photomask used for the manufacture of a semiconductor device.

On the other hand, in the case of using a photomask having an antireflection coating formed on the second main surface as a mask for acquiring the OPC rule data, the nonuniformity of the rule data depending on the positions within the mask is rendered very small. Also, it is possible to apply a uniform OPC correction rule regardless of the covering ratio and the position on the photomask so as to obtain a sufficient correcting effect.

Also, in the case of using a photomask having an antireflection coating formed on the back surface as defined in the present invention as a photomask used for the manufacture of a semiconductor device, it is possible to obtain prominent effects as described below.

Specifically, the covering ratio of the photomask used for the manufacture of a semiconductor device is rendered greatly different depending on the layer. The phenomenon that the exposure latitude and the cross sectional profile of the resist are made different is generated even if the pattern arrangement on the photomask is the same within the range in which the optical proximity effect is exerted. In this case, the resist process is changed such that an optimum exposure latitude and an optimum resist profile can be obtained for each layer. This implies that it takes time to determine the resist process, which may possibly bring about a delay in the subsequent schedule for manufacturing a semiconductor device such as the operation for acquiring the optical proximity effect correction (OPC) rule data. Also, the items to be supervised in the manufacturing line of a semiconductor device is increased so as to increase the manufacturing cost.

In the case of using a photomask having an antireflection coating formed on the back surface as defined in the present invention, it is possible to use the same resist process or a resist process small in the change even if the covering ratio on the photomask differs, which is advantageous both in time and cost.

It should also be noted that prominent effects can be produced as described below in the case of using a photomask of the present invention, in which an antireflection coating is formed on the back surface, as the photomask for acquiring the rule data for the OPC correction, which is used for the preparation of a photomask used for the manufacture of a semiconductor device.

Specifically, in the case of using a conventional photomask, in which an antireflection coating is not formed on the back surface, as a mask for acquiring the OPC rule data, the OPC rule data obtained are rendered nonuniform depending on the covering ratio on the photomask and on the positions such as the central portion and the peripheral portion. It is impossible to obtain a sufficient correcting effect in the case of applying the correction rule prepared on the basis of the data having the nonuniformity to a photomask for manufacturing a semiconductor device. Such being the situation, correction rules are separately acquired in practice depending on the covering ratio and the position on the photomask so as to apply these correction rules to a photomask used for the manufacture of a semiconductor device. The semiconductor device of the present level such as a DRAM requires the acquisition of correcting rule data several times to scores of times as much as that for the conventional semiconductor device in which a sufficient correcting accuracy was obtained by the acquisition of a single rule for each layer or pattern. The calculation time required the correction is also increased with increase in the amount of the rule data.

It should be noted that it is possible to eliminate substantially completely the reflection from the back surface of the transparent substrate, which causes the correction rule to be different depending on the covering ratio and the position of the photomask, by using a mask having the antireflection coating formed on the back surface as a mask for acquiring the OPC rule data. As a result, it is possible to decrease the number of acquired rules and to decrease the acquired data. At the same time, it is possible to expect an improvement in the correcting accuracy.

As described above in detail, according to the present invention, a photomask that permits performing a light exposure treatment that is unlikely to be affected by the peripheral pattern and a photomask blank for preparing the particular photomask can be obtained by suppressing the generation of the re-reflected light on the back surface of the photomask, said re-reflected light causing the cross sectional profile of the resist to be changed depending on the difference in the peripheral pattern. What should also be noted is that the light exposure step of a semiconductor wafer can be improved by using the photomask of the present invention as a photomask for acquisition of the optical proximity effect correction (OPC) rule and by using the photomask of the present invention in the light exposure step of the semiconductor wafer. For example, it is possible to shorten the acquisition time of the OPC rule (steps S1 to S4 shown in FIG. 22) and to improve the dimensional accuracy of the pattern formed in the light exposure step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask, comprising:

a transparent substrate having a first main surface and a second main surface opposite to said first main surface, said substrate transmitting exposed light;

a pattern formed on said first main surface of said transparent substrate and having at least one of a translucent film and a phase control film, said translucent film transmitting partly said exposed light, and said phase control film serving to control the phase of the exposed light; and a film of a laminate structure formed on said second main surface of the transparent substrate and including at least a first thin film containing magnesium oxide and a second thin film containing magnesium fluoride, said first thin film being interposed between said second main surface and said second thin film, and the refractive coefficient of the first thin film being larger than the refractive coefficient of said second thin film;

wherein said photomask meets the relationship of $n_{f1} \geq n_{f2} \times n_s^{1/2}$, where $n_s$ represents the refractive coefficient of the transparent substrate relative to the wavelength of the exposed light, $n_{f1}$ represents the refractive coefficient of the first film thin film, and $n_{f2}$ represents the refractive coefficient of the second thin film.

2. The photomask blank according to claim 1, wherein the main material of said transparent substrate is quartz.

3. The photomask according to claim 1, wherein said photomask is used in the manufacturing process of a semiconductor device.

4. A photomask blank, comprising:

a transparent substrate having a first main surface and a second main surface opposite to said first main surface, said transparent substrate transmitting exposed light;

a thin film formed on the first main surface of the transparent substrate and including at least one of a translucent film and a phase control film, said translucent film partly transmitting the exposed light, and said phase control film serving to control the phase of the exposed light; and a film of a laminate structure formed on said second main surface of the transparent substrate and including at least a first thin film containing magnesium oxide and a second thin film containing magnesium fluoride, said first thin film being interposed between the second main surface of the transparent substrate and said second thin film, and the refractive coefficient of said first thin film being larger than the refractive coefficient of said second thin film;

wherein said photomask meets the relationship of $n_{f1} \geq n_{f2} \times n_s^{1/2}$, where $n_s$ represents the refractive coefficient of the transparent substrate relative to the wavelength of the exposed light, $n_{f1}$ represents the refractive coefficient of the first thin film, and $n_{f2}$ represents the refractive coefficient of the second thin film.

5. The photomask according to claim 4, wherein the main material of said transparent substrate is quartz.

6. A photomask, comprising:

a transparent substrate having a first main surface and a second main surface opposite to said first main surface, said substrate transmitting exposed light;

a pattern formed on said first main surface of said transparent substrate and having at least one of an opaque film, a translucent film and a phase control film, said opaque film not transmitting said exposed light, said translucent film transmitting partly said exposed light, and said phase control film serving to control the phase of the exposed light; and a film of a laminate structure formed on said second main surface of the transparent substrate and including at least a first thin film, a second thin film and a third thin film, said first thin film being interposed between said second main surface and said second thin film, said second thin film being interposed between said first thin film and said third thin film, and the refractive coefficient of the second thin film being larger than the refractive coefficients of said first and third thin films.

7. The photomask according to claim 6, wherein said photomask is used in the manufacturing process of a semiconductor device.

* * * * *

UNITED STATES PATENT AND TRADEMARK OFFICE
CERTIFICATE OF CORRECTION

PATENT NO. : 6,627,356 B2
DATED : September 30, 2003
INVENTOR(S) : Kawamura et al.

It is certified that error appears in the above-identified patent and that said Letters Patent is hereby corrected as shown below:

Title page,
Item [54], Title, change "MANUFACTURING" to -- MANUFACTURE --.
Item [74], *Attorney, Agent, or Firm*, change "Garret" to -- Garrett --.

Column 21,
Line 5, change "photomask blank" to -- photomask --.

Column 22,
Line 4, change "photomask " to -- photomask blank --.

Signed and Sealed this

Sixteenth Day of December, 2003

JAMES E. ROGAN
*Director of the United States Patent and Trademark Office*